United States Patent [19]

Waggener

[11] Patent Number: 4,620,160
[45] Date of Patent: Oct. 28, 1986

[54] DIGITAL DEMODULATOR FOR CONTINUOUSLY PHASE OR FREQUENCY MODULATED SIGNALS

[75] Inventor: William N. Waggener, Sarasota, Fla.

[73] Assignee: Fairchild Weston Systems, Inc., Sarasota, Fla.

[21] Appl. No.: 682,218

[22] Filed: Dec. 17, 1984

[51] Int. Cl.$^4$ .............................................. H03D 5/00
[52] U.S. Cl. .................................... 329/104; 329/131; 329/135
[58] Field of Search ................. 329/50, 110, 122, 124, 329/131, 135; 375/80, 94, 98; 455/205, 207, 210, 214

[56] References Cited

U.S. PATENT DOCUMENTS 3,970,946  7/1976  Matsuo ........................... 329/135 X
4,336,500  6/1982  Attwood ......................... 329/122 X Primary Examiner—Eugene R. LaRoche
Assistant Examiner—Robert J. Pascal
Attorney, Agent, or Firm—Dale Gaudier

[57] ABSTRACT

A frequency and phase demodulating circuit provides direct frequency demodulation utilizing only addition, subtraction and multiplication steps. Division of signals is avoided, as is the need for a look-up table of trigonometric values corresponding to the results of such division. By maintaining a substantially constant input amplitude to a quadrature sampler, a number of approximations may be made without introduction of error. Compensation for actual signal variation, as well as for first order errors due to the approximation process of the invention, results in accurate frequency evaluation and avoids the necessity for differentiating an initial phase determination.

19 Claims, 11 Drawing Figures

DIGITAL DEMODULATOR FOR CONTINUOUSLY PHASE OR FREQUENCY MODULATED SIGNALS

TECHNICAL FIELD

This invention relates to signal demodulators, and more specifically to a demodulator for signals having continuous phase or frequency modulation, in which demodulation is carried out by digital techniques.

BACKGROUND ART

In the art of demodulation of phase or frequency modulated signals, typical approaches require the determination of an arctangent of a particular magnitude, obtained as a ratio of two signals which may be represented in analog or digital form. One example of this technique is found in U.S. Pat. No. 4,090,145 to Webb.

Webb describes a demodulator in which received input data are sampled by an analog-to-digital quadrature sampler, under control of a timing device, to provide a sequence of digital samples which are multiplied by quadrature digital signals. The result of the process is a pair of quadrature voltage samples, $E_1(t)$ and $E_2(t)$, respectively representing cosine and sine components of the input signal. As is known in the art, the modulating angle of the input signal is thereafter obtained by determining the arctangent of the ratio $E_1(t)/E_2(t)$.

The Webb patent discloses a digital circuit for determining the modulating phase angle, specifically illustrating in one embodiment a divider circuit to obtain the ratio and an arctangent calculator. It is well known that division is a time consuming operation. The Webb patent attempts to overcome the speed problem by providing a digital divider which requires the use of ROMs (Read Only Memories) for storing log tables in order to perform the division. Additionally, the Webb demodulator requires the use of a further ROM in a table-lookup procedure for determining the arctangent of the computed ratio.

Since the arctangent table, alone, does not identify the actual angle but can only identify an angle within a 45 degree range, an additional circuit is required in order to compute the specific octant in which the angle lies and thus finally to thereby determine the modulating angle.

However, the result does not yet provide the modulating frequency. Thus, where the signal of interest is frequency modulated, the prior art requires provision of a differentiator in order to determine the modulating frequency. As is known, differentiators are subject to significant errors due to transient noise signals.

U.S. Pat. No. 4,317,210 to Dekker et al similarly discloses a demodulator in which an arctangent computer and a differentiator are required.

Thus, the prior art provides a slow, cumbersome approach to frequency demodulation, subject to errors, requiring the use of complex division circuitry and necessitating incorporation of a table lookup technique and a differentiation process to obtain the modulating frequency.

Prior art analog demodulators are known, as represented by U.S. Pat. No. 3,045,180 to Losher. Losher obtains in-phase and quadrature signal samples and requires a conversion from rectangular to polar coordinates. Such demodulators, however, provide less accurate results in view of their susceptibility to variations in component tolerances, temperature drift problems, and the like.

It can thus be seen that there is a need for an efficient digital phase demodulator which avoids the use of division and arctangent computation, eliminates the requirement of a table lookup procedure to determine the arctangent, provides an output directly indicating the modulating angle and quadrant, and determines the modulating frequency without necessity for differentiation.

DISCLOSURE OF INVENTION

It is accordingly an object of the present invention to provide an improved digital phase and frequency demodulator overcoming the disadvantages of the prior art.

It is a more specific object of the invention to provide a digital phase and frequency demodulator for continuously phase or frequency modulated signals which does not require the use of division to obtain the modulating angle.

Yet another object of the invention is to provide a digital phase and frequency demodulator which utilizes only multiplication, addition and subtraction to extract modulation information from a phase or frequency modulated signal.

Still another object of the invention is to provide a digital demodulator which directly determines a modulating phase angle without requiring the use of lookup tables.

It is a further object of the invention to provide a digital phase and frequency demodulator which directly determines the modulating frequency of a frequency modulated signal.

It is an additional object of the invention to provide a digital demodulator for phase or frequency modulated signals in which the modulation information is obtained by maintaining the input signal at a substantially constant amplitude, and in which compensation is provided for variation of the signal from the constant value.

Yet another object of the invention is the provision of a digital demodulator for phase or frequency modulated signals in which the modulating information is obtained by an approximation applicable under certain conditions, and in which compensation and correction is provided for deviation from such conditions.

In accordance with these and other objects, the present invention provides a digital phase and frequency demodulator including a digital circuit for estimating a modulating phase angle of a received signal and further including circuitry for maintaining an input signal to a sampling circuit at a substantially contant amplitude, thus permitting the estimating circuit to estimate the modulation information by determination of sample differentials and by obtaining sums and differences of products of the samples and of sample differentials.

Preferably, the circuit for maintaining the input signal to the sampling circuit includes an AGC (automatic gain control) circuit. The AGC circuit includes a controlled gain amplifier operating on the received signal to control its gain prior to its application to the sampling circuit. The received signal amplitude is reconstructed from the samples, and the reconstructed amplitude is compared with a reference value to provide a deviation signal. A control circuit is used to control the gain of the amplifier to reduce the difference between the reconstructed signal and the reference.

Further, the invention more specifically provides a demodulator including a quadrature sampler, and the digital estimating circuit is further operable for obtaining cross products of one of the in-phase or quadrature samples multiplied by the sample differentials of the other.

Amplitude error correction is provided for correction of errors caused by variation in the input signal to the sampling circuit, and process correction is provided for correction of errors in the output due to first order errors of approximation. Circuitry is provided for obtaining specific sums, differences, and products of the samples and of various signals, in order to obtain the estimate, and to correct the same for amplitude and approximation errors. Preferably, the resulting estimate identifies the modulation frequency, the modulation angle is obtained by integration of the estimate.

In accordance with another feature of the invention, there is provided a method for demodulating a phase or frequency modulated signal, in which sequences of in-phase and quadrature signal components are obtained. The modulation information is obtained by obtaining sample differentials and by obtaining cross products of the samples and the sample differentials.

Preferably, the amplitude of the signal being sampled is maintained substantially constant by control of a gain circuit. Further, the inventive method provides for correction of a preliminary estimate of the modulation information by compensating for variation of the actual sampled signal amplitude from the constant value presumed thereof.

Moreover, first order errors caused by the approximation process are corrected by obtaining a sum of the products of the in-phase and quadrature samples and the respective sample differentials thereof. The sums of the products are multiplied by the determined deviation of the sampled signal from a reference value to provide a process correction factor which is then multiplied by the preliminary estimate to provide a signal representing the modulation frequency.

BRIEF DESCRIPTION OF THE DRAWING FIGURES

The foregoing and other objects, features and advantages of the invention will become apparent with reference to the following detailed description of the best mode for carrying out the invention, when taken in conjunction with the accompanying drawing figures wherein.

BEST MODE FOR CARRYING OUT THE INVENTION

Figure 1:
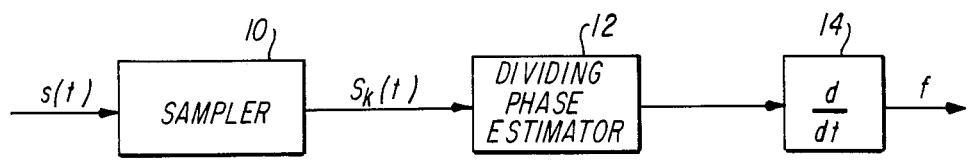
FIG. 1 shows a prior art phase demodulator.

Referring now to FIG. 1, a typical prior art phase and frequency demodulator is shown. In particular, in order to provide an output signal representing a modulation frequency f(t) of an input signal s(t), prior art demodulators utilize a sampler 10. The sampler receives at its input the incoming signal s(t) and provides a sequence of output samples $s_k(t)$ to a dividing phase estimator 12.

The phase estimator functions to derive the arctangent of a signal representing the tangent of the modulating phase angle of input signal s(t). Since the tangent may be obtained as a ratio of two signals representing sine and consine components of the input signal, prior art phase estimators must use dividing circuitry to implement the dividing process. Having obtained the ratio representing the tangent of the modulating phase angle, the prior art demodulator further requires implementation of a table-lookup procedure. Finally, to obtain the modulation frequency, the result of the phase estimation is required to be differentiated in a differentiator 14.

Figure 2:
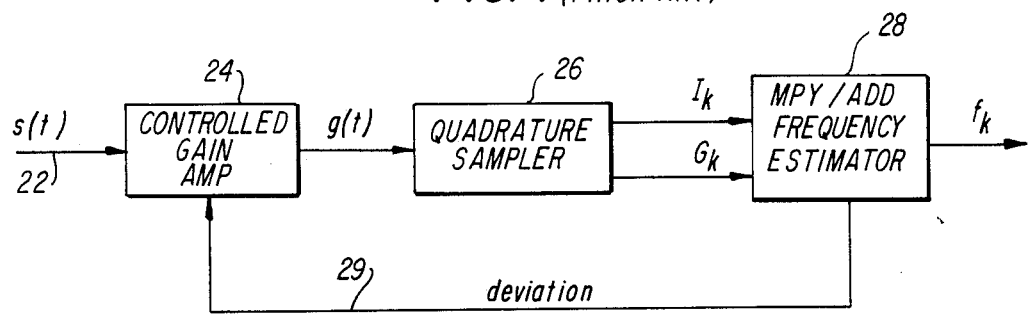
FIG. 2 shows a frequency demodulator constructed in accordance with the principles of the invention.

A frequency or phase demodulator in accordance with the present invention is broadly illustrated at FIG. 2 and is seen to be free from the deficiencies of the prior art. As shown in FIG. 2, the present invention receives the input signal s(t) on an input line 22 and applies the signal to a controlled gain amplifier 24. The resulting gain controlled signal g(t) is provided to a quadrature sampler 26. The quadrature sampler, as will be described in more detail below, provides output sequences representing in-phase and quadrature components $I_k$ and $Q_k$ of the gain-controller signal g(t). These sequences are input to a modulation frequency estimator 28 which, in accordance with the invention, requires neither a table lookup nor a division procedure to be performed.

Instead, the frequency estimator of the present invention merely requires multiplication and addition or subtraction to be performed, permitting utilization of inexpensive, reliable, and fast components. Advantageously, the output of frequency estimator 28 directly indicates the modulating frequency without need for further differentiating its output. As will be further apparent in the following description, frequency estimator 28 also provides outputs representing the modulating amplitude and phase angle of the input signal.

Additionally, the frequency estimator provides an output signal, representative of deviation of the amplitude of signal g(t) from a fixed value, to controlled gain amplifier 24 on a line 29. This signal is used in an AGC (automatic gain control) loop to control the gain of amplifier 24 to maintain the amplitude of the signal g(t) at a substantially constant value.

Figure 3:
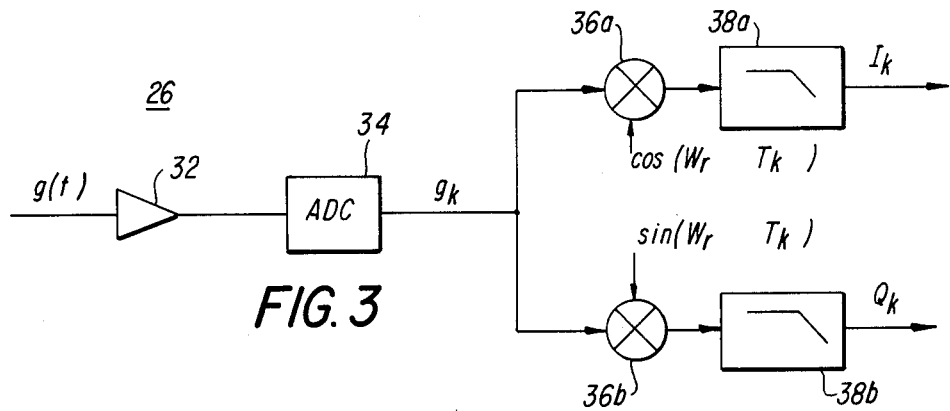
FIG. 3 shows a quadrature sampler used in the embodiment of FIG. 2.
Figure 4:
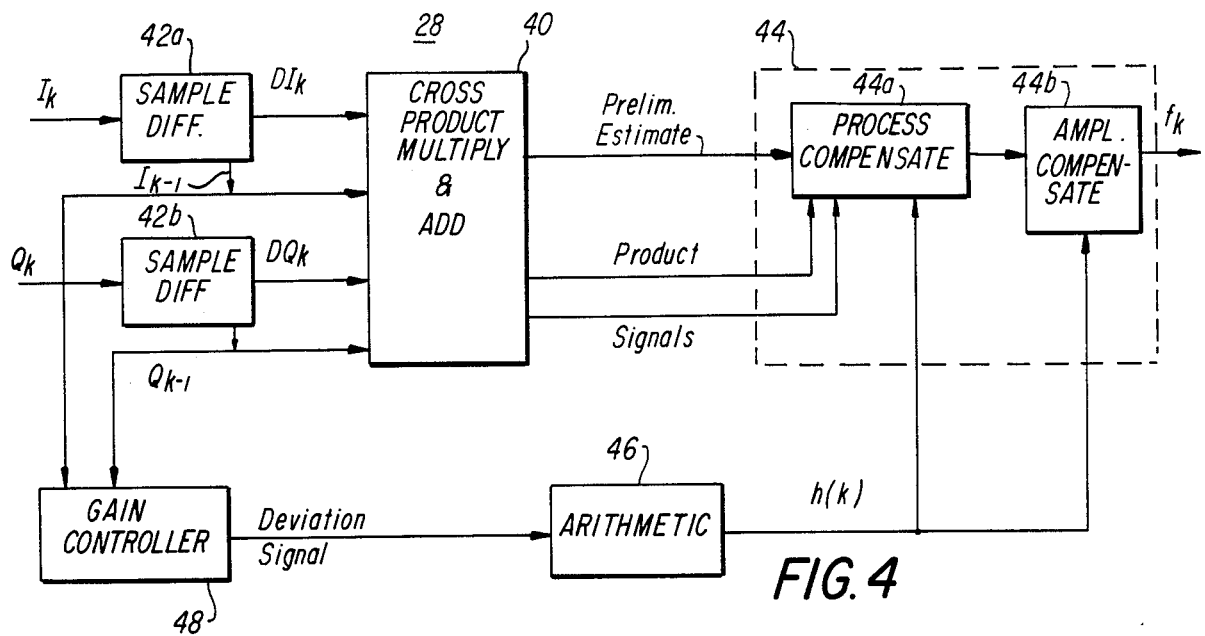
FIG. 4 shows a frequency estimator constructed in accordance with the invention as used in the embodiment of FIG. 2.

The primary components of the inventive arrangement of FIG. 2 are shown in greater detail in FIGS. 3 and 4, which illustrate the quadrature sampler and the frequency estimator, respectively.

Various types of quadrature sampling circuits are known and may be used in the present invention. The arrangement of FIG. 3 shows the input signal g(t) passing through an amplifier 32 prior to application to the input of an analog-to-digital sampling converter 34 which samples the signal at a rate in excess of the Nyquist sampling rate and quantizes the signal into digital words $g_k$. It is these digital words which are processed by the digital frequency estimator 28. The digital signals $g_k$ are converted into in-phase and quadrature components by digital multipliers 36a and 36b, respectively. The multipliers are used to multiply the sampled data by samples of a reference signal at at frequency $w_r$, using the sine and consine components thereof, respectively. Such sampling techniques are disclosed, for example, in Viterbi, *Principles of Coherent Communication*, McGraw Hill Book Company, NY, 1966.

An input signal g(t), representing a carrier frequency $w_c$ modulated by a time varying amplitude a(t) and a time varying phase angle $\theta(t)$, is described by $$g(t) = a(t) \cos [w_c t + \theta(t)],$$

where $$\theta(t) = \int_{-\infty}^{t} f(t) dt.$$

Where the signal g(t) is sampled at times $$t_k = k\Delta T, \text{ for } k = 0, 1, \ldots, k, \ldots$$

there results a sequence of signal samples $$g(k) = a(k) \cos [w_c k \Delta T + \theta_k] \tag{1}$$

The sequence represented by Equation 1 is provided as the input to multipliers 36a and 36b in FIG. 3. The in-phase and quadrature components resulting from the multiplication performed by the multipliers are, respectively, $$I_k = (\tfrac{1}{2}) a(k) \cos [\Delta w k \Delta T + \theta_k] \tag{2}$$

and $$Q_k = (\tfrac{1}{2}) a(k) \sin [\Delta w k \Delta T + \theta_k] \tag{3}$$

plus additional terms at the sum frequency $w_c + w_r$.

In Equation (2) and (3), the term w represents the difference $w_c - w_r$.

The additional terms at the higher sum frequency are removed by digital low pass filters 38a and 38b, so that the output signals $I_k$ and $Q_k$ of the filters are accurately represented by Equations 2 and 3.

The instantaneous phase of the arguments of Equations 2 and 3 is clearly $$\theta_k + k\Delta w \Delta T = \tan^{-1}(Q_k/I_k) \tag{4}$$

and the frequency may be estimated by $$f_k = (\theta_k - \theta_{k-1})/\Delta T. \tag{5}$$

For mathematical simplicity, let it be assumed that $T = 1$, although any value may be used. Equation (5) together with Equation (4) thus yields $$f_k = \tan^{-1}(Q_k/I_k) - \tan^{-1}(Q_{k-1}/I_{k-1}) - \Delta w \tag{6}$$

Assuming the reference carrier frequency is tuned exactly to the incoming carrier frequency, so that w=0, by using a mathematical identity Equation (6) becomes $$f_k = \tan^{-1}[(Q_k I_{k-1} - I_k Q_{k-1})/(I_k I_{k-1} + Q_k Q_{k-1})] \tag{7}$$

Upon further manipulation, and with recognition that the in-phase and quadrature components are related to the amplitude a(k) of the kth sample g(k) by $$I_{k-1}^2 + Q_{k-1}^2 = (A_{k-1})^2/2 \tag{8}$$

where $A_{k-1}$ is the rms amplitude and $= \dfrac{a(k-1)}{\sqrt{2}}$ \hfill (8)

there results the representation of the modulating frequency for the kth sample of $$f_k = \arctan\left[\frac{2 \cdot (DQ_k I_{k-1} - DI_k Q_{k-1})}{A_{k-1}^2 \cdot \left[1 + \dfrac{(DI_k I_{k-1} + DQ_k Q_{k-1})}{(A_{k-1})^2/2}\right]}\right] \tag{9}$$

where $DQ_k = Q_k - Q_{k-1}$ and $DI_k = I_k - I_{k-1}$ are sample differentials, representing the change in the in-phase and quadrature samples over one sample period.

For small values of its argument, the arctan function is essentially equal to its argument. Thus, a very good approximation to Equation 9 may be had in situations wherein the argument is small by relating $f_k$ to the argument itself, rather than to the arctangent function. It is noted that by maintaining the amplitude of the input signal to the quadrature sampler substantially constant, the sample deviations, which are factors of the numerator of Equation (9), are significanty smaller than the amplitude of the signal, $A_{k-1}^2$, which is a factor of the denominator. Accordingly, for sufficiently small values of argument, Equation (9) becomes $$f_k = \frac{2 \cdot (DQ_k I_{k-1} - DI_k Q_{k-1})}{A_{k-1}^2 \left[1 + \dfrac{(DI_k I_{k-1} + DQ_k Q_{k-1})}{(A_{k-1})^2/2}\right]} \tag{10}$$

By keeping the amplitude of the signal entering the quadrature sampler substantially constant, the sample differentials may be made quite small with respect to the signal amplitude, so that the second term in the denominator factor of Equation (10) becomes quite small when compared to unity.

It is known that a mathematical power series representation of a denominator including a factor $(1+x)$ becomes $$(1+x)^{-1} \approx 1 - x \tag{11}$$

for values of x sufficiently small with respect to unity. Thus, by maintaining the signal amplitude substantially constant the expansion of Equation (11) may be applied to the denominator of Equation (10) as follows:

$$\frac{1}{\left[1 + \dfrac{(DI_k I_{k-1} + DQ_k Q_{k-1})}{(A_{k-1})^2/2}\right]} \approx \tag{12}$$

$$\left[1 - \frac{(DI_k I_{k-1} + DQ_k Q_{k-1})}{(A_{k-1})^2/2}\right] \quad (12)$$

As a measure of deviation of the signal amplitude from a constant value, the term may be defined as follows $$\epsilon_k = A_{k-1}^2 - A_0^2 \quad (13)$$

where $A_0$ is some fixed reference value. The deviation signal generated in frequency estimator 28 in accordance with Equation (13), is used in the present invention to control an AGC circuit to maintain the input signal to the sampler substantially constant, and thus to permit the use of the simplifying approximations developed herein.

In accordance with the foregoing, by maintaining a substantially constant input level to the frequency estimator, Equation (10) becomes $$f_k = \frac{2(DQ_k I_{k-1} - DI_k Q_{k-1})}{A_0^2 (1 + \epsilon_k/A_0^2)} \cdot \left[1 - \frac{(DI_k I_{k-1} + DQ_k Q_{k-1})}{(A_0^2/2)(1 + \epsilon_k/A_0^2)}\right] \quad (14)$$

Finally, the small value of the deviation signal with respect to the fixed amplitude $A_0^2$ permits each of the two factors of Equation (14) to be simplified with the aid of Equation (11), so that $$f_k = C(DQ_k I_{k-1} - DI_k Q_{k-1})(1 - \epsilon_k/K_0^2) \cdot [1 - C(DI_k I_{k-1} + DQ_k Q_{k-1})(1 - \epsilon_k/A_0^2)], \quad (15)$$

where C is a constant.

The results of Equation (15) provide an estimate for the modulating frequency for the kth sample which may be obtained, under suitable constraints, by simple sums, differences, and products, without any requirement for division or table lookup procedures. The constraints are met by maintaining the input signal to the sampler 26 at a relatively constant level, which may be provided by the AGC circuit previously described or by any other suitable means. Moreover, the result of Equation (15) is particularly applicable to frequency modulation and demodulation systems, inasmuch as there is provided a direct output representing the modulating frequency, without the necessity of differentiation of a computed modulation angle.

As a clarification of the various terms of Equation (15), it will be recalled that the first factor in the first line of the equation was first noted at Equation (9), and represents the significant factor used to approximate the modulation frequency. Thus, in accordance with the invention, a difference between cross products of the in-phase sample and quadrature sample differential, on the one hand, and the quadrature sample and in-phase sample differential, on the other, provides a preliminary estimate of the modulation frequency.

For sample differentials approaching zero, the denominator of Equation (9) approaches a constant (represented by C in Equation 15) and may be ignored. However, for non-constant signal amplitude, the factor obtained in Equation (12), which represents the denominator of Equation (12), which represents the denominator of Equation (9), corrects first order errors in the preliminary estimate obtained by the approximation process of the present invention. This "process compensating" factor is included at the second line of Equation (15) and is obtained as a sum of products of sample differentials and the corresponding samples.

Additionally, from Equation (14) it is seen that the denominator terms may be ignored, to within a constant, if the input amplitude to the sampler is in fact constant and equal to the reference value $A_0^2$. Where the input amplitude varies, but is maintained quite close to the reference value, the deviation from constant amplitude represented by factors common to the denominators of both components of Equation (14) is nonetheless small. Accordingly, with the aid of Equation (13), these factors may be replaced by the multiplicative factor $(1 - \epsilon_k/A_0^2)$ in Equation (15) to provide compensation for variation in input amplitude.

Referring now to FIG. 4, operation of the inventive structure will be understood to correspond to the previously derived mathematical basis for the present invention. Digital frequency estimator 28 receives the in-phase and quadrature samples from quadrature sampler 26, as previously described, in order to provide the appropriate cross products, representing the preliminary estimate of frequency, and the corresponding products, representing the process compensation term. A multiplier/adder 40 provides the appropriate products after receiving input signals representing the sample differentials and the delayed samples.

Figure 5:
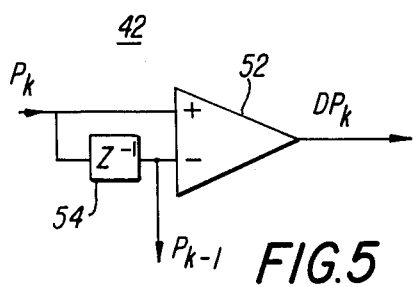
FIG. 5 shows a sample differencing circuit used in the frequency estimator of FIG. 4.

A pair of sample differencing circuits 42a and 42b respectively receive the in-phase and quadrature samples provided by sampler 26. The differencing circuits, shown in detail at FIG. 5, are described below. For the purpose of description of the frequency estimator, it is sufficient to note that each circuit provides an output signal representing a sample differential for the samples input thereto, and further provides a delayed sample output, to make available to the multiplier/adder 40 the values $DI_k$, $DQ_k$, $I_{k-1}$ and $Q_{k-1}$ needed to form the various products and cross products.

Multiplier/adder 40 provides a preliminary frequency estimate, in the form of an output signal representing the difference of cross products multiplied by the constant C in accordance with Equation (15), to a compensation circuit 44. The compensation circuit performs the various multiplications noted in Equation (15) to correct for process approximations and for amplitude variations, as previously described.

Since the two compensation processes previously described both involve multiplication, it is seen that the compensations may be provided in either order. That is, the preliminary estimate may first be compensated for process approximation and then for amplitude variation, or in the reverse order. In fact, one or both compensations may be omitted from the circuit function under appropriate circumstances. Thus, for situations in which amplitude variation is in fact negligible, amplitude deviation compensation may be omitted. For circumstances in which the modulation frequency need not be known with the greatest precision, and in which a broader indication of range is sufficient, process compensation may be omitted, possibly together with the amplitude deviation compensation.

In the preferred embodiment, however, compensating circuit 44 provides both amplitude and process compensation as previously described. In FIG. 4 the compensation circuit includes a first order process compensator 44a and an amplitude compensator 44b. Process compensator 44a receives at its input the signal representing the preliminary estimate of modulation frequency. Additionally, the product signals identified in Equation (12) and in the second term of the process compensation factor of Equation (15) are provided to the compensator by the multiplier/adder 40. Finally, a factor substantially identical to the amplitude compensating factor is seen to be part of the process compensation factor of Equation (15). Thus, a signal h(k), representing the amplitude compensation factor, is also input to the process compensator 44a.

The output signal of compensator 44a, having been compensated for the approximation process to remove first order errors therefrom, is provided to amplitude compensator 44b for multiplication by the amplitude compensation factor h(k).

The output of amplitude compensator 44b thus represents the modulating frequency of the kth sample of the input signal.

In order to provide the amplitude compensating signal h(k), the deviation signal $\epsilon_k$ needs to be multiplied by a constant, corresponding to $A_0^{-2}$, and subtracted from unity. An arithmetic circuit 46 performs the specified functions on the deviation signal which is itself obtained by a gain control circuit 48.

It will be recalled that, in accordance with Equation (13), the deviation signal is obtained as a difference between the squares of the amplitude of the (k−1)th sample and the constant reference. Gain controller 48 includes squaring circuits to obtain the squares of the (k−1)th in-phase and quadrature samples, a summer to obtain a signal proportional to $A_{k-1}^2$ therefrom, and a differencing circuit to provide an output in accordance with Equation (13). Thus, the controller provides the deviation signal to arithmetic circuit 46. Additionally, however, it will be recalled from FIG. 2 that the present invention provides a control signal, based on the amplitude deviation, to the AGC controlled gain amplifier in order to maintain the input g(t) to the sampler 26 substantially constant.

In order to provide simplified control, the controlled gain amplifier is preferably an analog device, and is responsive to an analog control signal. Thus, controller 48 provides digital-to-analog conversion for the deviation signal, and further provides smoothing to the converted signal.

Referring now to FIGS. 5–11, the various elements of FIG. 4 are shown in greater detail. Referring specifically to FIG. 5, the sample differencing circuits 42a, 42b are each shown to comprise an amplifier 52 together with a one sample time delay 54, indicated by the operator $Z^{-1}$. For each differencing circuit, the difference between the current sample $P_k$ and the previous sample $P_{k-1}$, $DP_k$, is obtained by the amplifier 52, where P may represent either the I or Q component of the sampled signal. In accordance with the structure of FIG. 4, the delayed samples are also provided as outputs of the differencing circuits, for use in the multiplier/adder 40 and for use in the gain controller, as seen in conjunction with FIG. 7.

Figure 6:
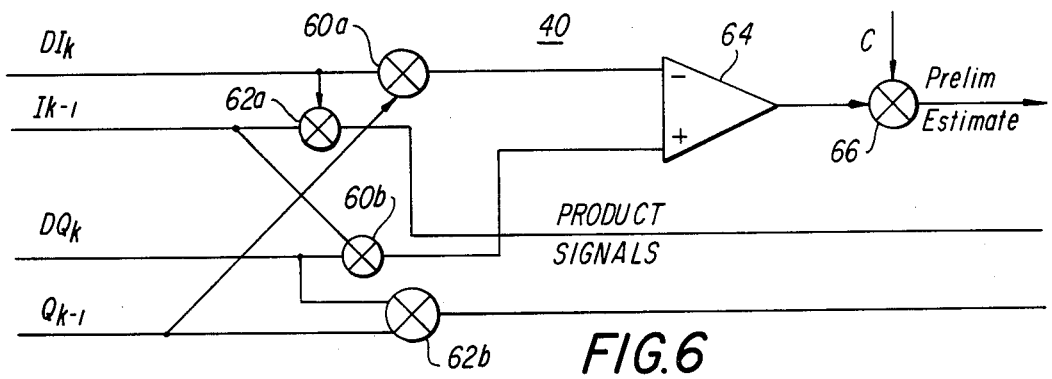
FIG. 6 shows a multiplier/adder used in the frequency estimator of FIG. 4.

FIG. 6 shows the details of multiplier/adder 40. As described with respect to FIG. 4, multiplier/adder 40 is shown as receiving both the sample differentials for sample time k and the quadrature samples for time k−1. A pair of multipliers 60a and 60b provide cross products of one of the in-phase and quadrature samples by the sample differential of the other. A second pair of multipliers, 62a and 62b, provide cross products between each component and its corresponding sample differential.

The output of multiplier 60a is input to the inverting terminal of a differencing amplifier 64 and the output of multiplier 60b is input to the noninverting terminal of amplifier 64. Thus, amplifier 64 provides an output corresponding to the difference in cross products found in the first factor of Equation (15). An input constant C is provided to a multiplier 66, together with the output of amplifier 64, corresponding to the constant coefficient of Equation (15). Thus, multiplier 66 outputs the preliminary estimate of the modulating frequency of the sampled signal.

The outputs of multipliers 62a, 62b provide the products found in the second factor of Equation (15), i.e., the process compensating term. As shown in FIG. 4, these products are provided to the process compensator 44a.

Figure 7:
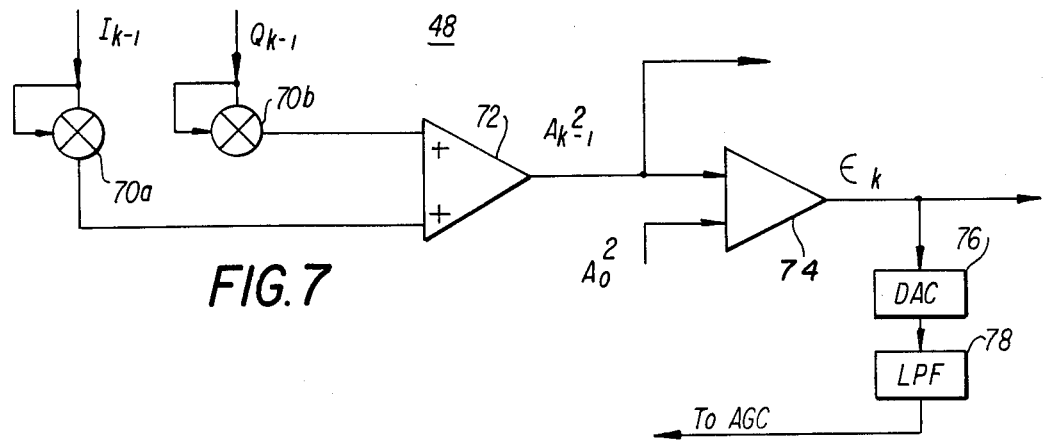
FIG. 7 shows a gain controller used in the frequency estimator of FIG. 4.

FIG. 7 shows the gain controller 48 of FIG. 4, receiving as inputs the delayed in-phase and quadrature samples output by sample differencing circuits 42a and 42b. A pair of squaring circuits 70a, 70b include multipliers connected to receive the inputs at both input terminals and to provide output signals corresponding to the squares of the inputs. Summing amplifier 72 receives at its inputs the two outputs of multipliers 70a, 70b, to provide at its output a signal representative of $A_k^2$, the square of the amplitude of the input signal at the previous sample time. This signal is compared with a reference amplitude in difference amplifier 74, in accordance with Equation (13), in order to provide a deviation signal for application to the arithmetic circuit 46 and to the controlled gain amplifier 24, in a gain control loop for maintaining the output of amplifier 24 as nearly constant as possible.

In this regard, it should be recognized that, although attenuated, the variations in output of amplifier 24 track the amplitude variations at its input. Thus, the output signal of summing amplifier 72 represents the square of the amplitude of the input signal at the previous sample, and in fact provides an amplitude demodulation of the input signal. Accordingly, this signal is shown in FIG. 7 as providing an output of the system which provides amplitude, phase and frequency demodulation.

As has been previously mentioned, the deviation signal output by amplifier 74 is converted to an analog signal prior to application to the gain controlled amplifier 24. Towards that end, a digital-to-analog-converter 76 is connected to the output of amplifier 74. A low-pass filter 78 smoothes the analog output of converter 76 to remove higher order conversion components and other noise therefrom. The output of filter 78 is provided as the control signal for the amplifier 24, thereby closing the gain control loop in order to maintain the input signal to the quadrature sampler 26 as nearly constant as possible.

Figure 8:
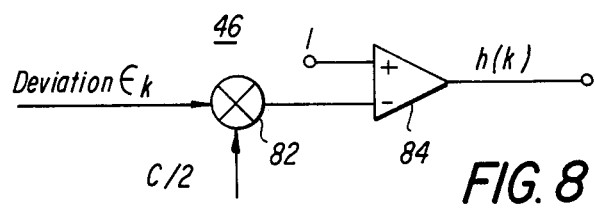
FIG. 8 shows an arithmetic circuit used in the frequency estimator of FIG. 4.

Referring now to FIG. 8, there is illustrated the arithmetic circuit 46 previously described in connection with FIG. 4. Circuit 46 receives the deviation signal output by gain controller 48 and includes a multiplier 82 and a difference amplifier 84 for converting the deviation signal to the amplitude compensating signal. More specifically, a constant corresponding to $A_0^{-2}$ is input to multiplier 84 to provide a product which, after subtraction from unity, results in the amplituude compensating signal h(k). As has been disclosed, this signal is provided to both compensating circuits 44a and 44b.

Figure 10:
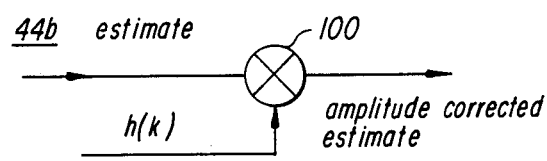
FIG. 10 shows an amplitude compensator used in the frequency estimator of FIG. 4.
Figure 9:
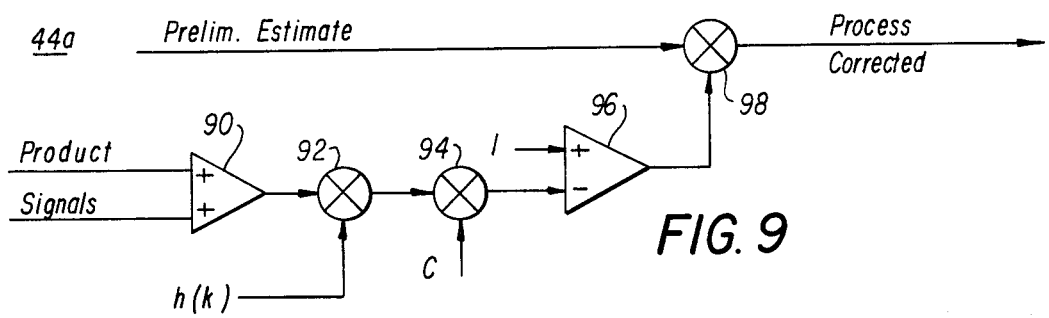
FIG. 9 shows a process compensator used in the frequency estimator of FIG. 4.

FIG. 9 shows the process compensator 44a while FIG. 10 illustrates the amplitude compensator 44b. As has previously been shown, multiplication of the sum of the product signals provided by multiplier/adder 40 by the amplitude compensating signal and by the constant, followed by subtraction of the product from unity, results in the process compensation factor of Equation (15). The circuit of FIG. 9 performs these functions in a straightforward manner. A summing amplifier 90 receives the input product signals from multiplier/adder 40. The sum is multiplied by the amplitude compensating factor in a multiplier 92, and the product further multiplied by the multiplicative constant in a further multiplier 94.

A subtracting amplifier 96 subtracts the output of the further multiplier 94 from unity, to provide at its output the process compensating factor. A final multiplier 98 is used to multiply the preliminary estimate of modulating frequency, provided as a difference of cross products by multiplier/adder 40, by the process compensating factor represented by the signal output by amplifier 96. The output of multiplier 98 thus represents the process corrected estimate of modulating frequency, in which first order approximation samples are corrected.

FIG. 10 shows the amplitude compensating circuit, which is comprised of a multiplier 100 receiving at one of its inputs the process compensated output of compensator 44a in FIG. 9 and at its other input the amplitude correcting factor provided on the output of arithmetic circuit 46 in FIG. 8. The output of multiplier 100 thus provides a process and amplitude compensated estimate of the modulating frequency of the input signal.

As has been previously mentioned, and as is now apparent upon consideration of the circuitry used to implement the compensating circuits, the preliminary estimate may first be provided to multiplier 100 and its output may be provided as the input to multiplier 98. Since multiplication is commutative, the resultant signal represents a proper estimate of the modulating frequency in either connection.

Figure 11:
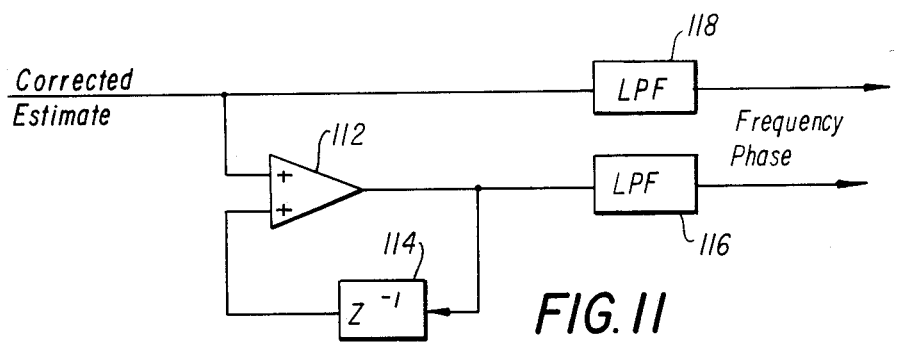
FIG. 11 shows an integrating circuit used in conjunction with the frequency estimator of FIG. 4 to obtain phase demodulation of the input signal.

Finally, if it is desired to obtain an estimate of modulating phase angle, the digital integrating circuit of FIG. 11 may be utilized. In accordance with the illustrated circuit, the compensated, corrected frequency estimate is provided to one input of a summing amplifier 112. Amplifier 112 is connected so its output signal passes through a one sample time delay circuit 114 and thereafter is fed back to the other input of the amplifier. Such circuits are known in the art and no elaboration is necessary. A pair of smoothing low pass filters, shown at 116 and 118, provide further smoothing of the phase and frequency estimates prior to output.

It should be recognized that, although specific hardware circuitry has been provided as an illustrative embodiment of the invention, other circuits may be used to carry out the objects and features thereof. More specifically, a programmed computer may be used to carry out the inventive method performed by the various circuits of the illustrated preferred embodiment, and that such a programmed computer is included in the scope of the claims appended hereto.

There has thus been shown a method and apparatus for efficiently providing phase, frequency and amplitude demodulation of a modulated signal, using digital components, free of dividing steps or circuitry and similarly free of requirements for storage of lookup trigonometric tables. In accordance with the invention, these advantages are achieved by the use of a gain control circuit for maintaining the input amplitude to a sampling circuit substantially constant.

The preceding specification describes a preferred embodiment of the invention as an illustration and not a limitation thereof. It will be appreciated that various modifications, variations and equivalents will occur to those skilled in the art and that such modifications, variations and equivalents are within the scope of the invention as recited in the appended claims.

What is claimed is:

1. Digital demodulating apparatus comprising:
   sampling means for sampling a received phase or frequency modulated signal and for providing samples thereof;
   digital circuit estimating means receiving said samples of the received signal for providing a signal representing a first estimate of a modulating phase angle of the received modulated signal; and
   means for maintaining a substantially constant input amplitude to said sampling means thereby to permit said digital circuit estimating means to provide said signal representing said first estimate of the modulating phase angle of the received signal by determination of sample differentials and by adding and subtracting products of said samples and said differentials.

2. A digital demodulating apparatus as recited in claim 1 wherein said means for maintaining a substantially constant input amplitude comprises gain control circuitry connected in a feedback loop including:
   controlled gain means operating on the received signal and providing a gain controlled form thereof to said sampling means;
   means for reconstructing said received signal amplitude from said samples;
   means for comparing the reconstructed signal with a reference value and for generating a deviation signal indicative of differences between the reconstructed signal and the reference; and
   control means for controlling gain of said controlled gain means to reduce the difference between the reconstructed signal and the reference.

3. A digital demodulating apparatus as recited in claim 1 wherein said sampling means comprises:
   quadrature sampling means for sampling a received modulated signal and for providing in-phase and quadrature samples thereof; and wherein
   said means for estimating is further operable for determining sample differentials of the in-phase and quadrature samples and for cross multiplying one of said in-phase and quadrature samples by the sample differential of the other.

4. A digital demodulating apparatus as recited in claim 3 wherein said digital circuit phase estimating means comprises:
   first means for obtaining said sample differentials of said in-phase and quadrature samples; and
   cross multiplying means for multiplying said one of said samples by the sample differential of the other to provide cross products thereof.

5. A digital demodulating apparatus as recited in claim 4 further comprising difference means connected to said cross multiplying means for providing an output signal representative of a difference between said cross products.

6. A digital demodulating apparatus as recited in claim 4 further comprising amplitude error correcting means for correcting errors in said signal representing the first estimate of modulating angle caused by variation in the amplitude of the input to said quadrature sampling means.

7. A digital demodulating apparatus as recited in claim 4 further comprising process correcting means for correcting errors in said signal representing the first estimate of modulating angle caused by first order errors of approximation.

8. A digital demodulating apparatus as recited in claim 3 wherein:
said quadrature sampling means comprises means for providing sequences of samples of in-phase and quadrature components $I_1, I_2, \ldots, I_k$ and $Q_1, Q_2, \ldots, Q_k$ representing said received modulated signal at times $t = T, 2T, \ldots, kT$ where T is a sampling interval,
said digital circuit estimating means comprises computing means receiving said sequences of samples for providing said signal representing said first estimate as an output having a value $f_k$ as a function of said samples, wherein $$f_k = C[DQ_k I_{k-1} - DI_k Q_{k-1}]$$

$$DQ_k = Q_k - Q_{k-1}$$

$$DI_k = I_k - I_{k-1}$$

and C is a constant.

9. A digital demodulating apparatus as recited in claim 8 further comprising amplitude error correcting means for comparing amplitude values $A_k$ of the input signals at various sample times k with a fixed reference $A_0$ and providing an error signal at sample time k given by $$\epsilon_k = A_{k-1}^2 - A_0^2$$

and multiplying means for multiplying the output of said computing means by $$1 - \epsilon_k / A_0^2$$

thereby to compensate for errors in said signal representing said first estimate caused by variation in amplitude of the input signal.

10. A digital demodulating apparatus as recited in claim 8 further comprising process correcting means for correcting errors in said signal representing said first estimate caused by first order errors of approximation.

11. A digital demodulating apparatus as recited in claim 10 wherein said process correcting means comprises factor computing means for computing a factor pc according to $$pc = DI_k I_{k-1} + DQ_k Q_{k-1},$$

amplitude comparing means for comparing amplitude values $A_k$, representative of the input signals at various samples times k, with a fixed reference $A_0$ and providing an error signal at sample time k given by $$\epsilon_k = A_{k-1}^2 - A_0^2$$

and correction factor means for computing a process correction term p given by $$p = [1 - (1 - \epsilon_k / A_0^2) \times pc \times 2 / A_0^2]$$

together with
multiplying means for multiplying said first estimate output $f_k$ of said computing means by p thereby to compensate for first order errors in said first estimate.

12. A digital demodulating apparatus as recited in claim 3 wherein said first estimating means includes means for providing a first estimate of a modulating frequency of the input signal.

13. A digital demodulating apparatus as recited in claim 12 further comprising angle modulation estimating means for providing modulation angle estimates, including integrating means for integrating the output of said computing means, as corrected, to obtain an estimate of the modulation angle.

14. A method of demodulating a phase or frequency modulated signal comprising the steps of:
(a) sampling sequences of samples of in-phase and quadrature components $I_1, I_2, \ldots, I_k$ and $Q_1, Q_2, \ldots, Q_k$ of the modulated signal at times $T_1, T_2, \ldots, T_k$;
(b) obtaining sample differentials $DI_k$ and $DQ_k$ for the in-phase and quadrature components defined by $DI_k = I_k - I_{k-1}$ and $DQ_k = Q_k - Q_{k-1}$;
(c) obtaining cross products $I_{k-1} DQ_k$ and $Q_{k-1} DI_k$ of the samples and sample differentials; and
(d) obtaining a first estimate of a modulating frequency of said modulated signal as a scaled difference of said cross products.

15. A method for demodulating a modulated signal as recited in claim 14 comprising the further step of maintaining the amplitude of the signal sampled in step (a) substantially constant.

16. A method of demodulating a modulated signal as recited in claim 15 comprising the further step of correcting the first estimate for variations in the amplitude of the signal sampled in step (a).

17. A method of demodulating a modulated signal as recited in claim 14 comprising the further step of correcting for first order errors of approximation generated in step (d).

18. A method for demodulating a modulated signal as recited in claim 17 wherein said further step includes the steps of:
determining a deviation of the sampled signal from a reference value;
obtaining a sum of products of samples of said in-phase and quadrature components and the respective sample differentials thereof;
multiplying the sum of products by the determined deviation to obtain a process correction factor; and
multiplying the first estimate by said process correction factor to provide a signal representing the modulating frequency of said modulated signal substantially free of said first order errors of approximation.

19. A digital demodulating apparatus as recited in claim 1 wherein said digital circuit estimating means is operable for providing said signal representing said first estimate directly and for avoiding computation of an error of said modulating phase angle, and
further including compensating means for converting said first estimate to a final estimate by correcting mathematical approximations used in obtaining said first estimate, said compensating means connected in a feed-through arrangement with said digital circuit estimating means.

* * * * *